United States Patent
Guo et al.

(10) Patent No.: US 11,525,418 B2
(45) Date of Patent: Dec. 13, 2022

(54) INJECTION CONTROL DEVICE

(71) Applicant: DENSO CORPORATION, Kariya (JP)

(72) Inventors: Xinyu Guo, Kariya (JP); Masashi Inaba, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/357,012

(22) Filed: Jun. 24, 2021

(65) Prior Publication Data

US 2021/0404403 A1 Dec. 30, 2021

(30) Foreign Application Priority Data

Jun. 29, 2020 (JP) .............................. JP2020-111595

(51) Int. Cl.
*F02D 41/20* (2006.01)
*G01R 31/64* (2020.01)

(52) U.S. Cl.
CPC ............ *F02D 41/20* (2013.01); *G01R 31/64* (2020.01); *F02D 2200/0606* (2013.01)

(58) Field of Classification Search
CPC ............ F02D 41/20; F02D 2200/0606; F02D 2041/2006; F02D 41/22; G01R 31/64
See application file for complete search history.

(56) References Cited

U.S. PATENT DOCUMENTS

| 11,181,068 B1* | 11/2021 | Kato .................... F02D 41/1495 |
| 11,313,308 B2* | 4/2022 | Kanai ................... F02D 41/221 |
| 11,326,538 B2* | 5/2022 | Kato .................... F02D 41/2467 |
| 2017/0268449 A1* | 9/2017 | Nagata .................... F02M 61/16 |
| 2018/0209373 A1* | 7/2018 | Yoshiume ............ F02D 41/0255 |
| 2020/0284214 A1 | 9/2020 | Inaba et al. |
| 2021/0372340 A1* | 12/2021 | Suganuma .............. F02D 41/26 |
| 2021/0388791 A1* | 12/2021 | Inaba ....................... F02D 41/20 |
| 2021/0404407 A1* | 12/2021 | Shirakawa .............. F02D 41/20 |
| 2022/0034278 A1* | 2/2022 | Kaneda .................... F02D 41/22 |

FOREIGN PATENT DOCUMENTS

| JP | 2006257965 A * | 9/2006 | ............ F02D 41/20 |
| JP | 2007066978 A * | 3/2007 | |
| JP | 2007113547 A * | 5/2007 | ............ F02D 41/20 |
| JP | 2016-033343 A | 3/2016 | |
| JP | 2016094844 A * | 5/2016 | |
| JP | 2017125441 A * | 7/2017 | |
| JP | 6181865 B2 * | 8/2017 | ............ F02D 41/20 |
| WO | WO-2006003785 A1 * | 1/2006 | ........... G01R 31/028 |
| WO | WO-2015174310 A1 * | 11/2015 | ............ F02D 41/20 |
| WO | WO-2016125688 A1 * | 8/2016 | ............ F02D 41/20 |

* cited by examiner

*Primary Examiner* — David Hamaoui
(74) *Attorney, Agent, or Firm* — Posz Law Group, PLC

(57) ABSTRACT

An injection control device executes a current-drive of a fuel injection valve to inject fuel into an engine. The injection control device includes: a drive controller that controls energization by correcting an energization instruction time when injecting the fuel by executing the current-drive of the fuel injection valve; an estimated energization time correction amount calculation unit that calculates an estimated energization time correction amount; and a deterioration determination unit that determines deterioration of the charging capacitor based on a calculated estimated energization time correction amount and the energization time correction amount.

5 Claims, 6 Drawing Sheets

INJECTION CONTROL DEVICE

CROSS REFERENCE TO RELATED APPLICATION

The present application claims the benefit of priority from Japanese Patent Application No. 2020-111595 filed on Jun. 29, 2020. The entire disclosure of the above application is incorporated herein by reference.

TECHNICAL FIELD

The present invention relates to an injection control device that controls opening and closing of a fuel injection valve.

BACKGROUND

An injection control device is used to inject fuel into an internal combustion engine by opening and closing a fuel injection valve. The injection control device opens the fuel injection valve that is electrically drivable by passing current to the fuel injection valve. In recent years, an ideal current profile for energization current based on a command injection quantity has been set, and the injection control device opens the fuel injection valve by applying current to the fuel injection valve on the basis of the ideal current profile.

SUMMARY

According to an example embodiment, an injection control device executes a current-drive of a fuel injection valve to inject fuel into an engine. The injection control device includes: a drive controller that controls energization by correcting an energization instruction time when injecting the fuel by executing the current-drive of the fuel injection valve; an estimated energization time correction amount calculation unit that calculates an estimated energization time correction amount; and a deterioration determination unit that determines deterioration of the charging capacitor based on a calculated estimated energization time correction amount and the energization time correction amount.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
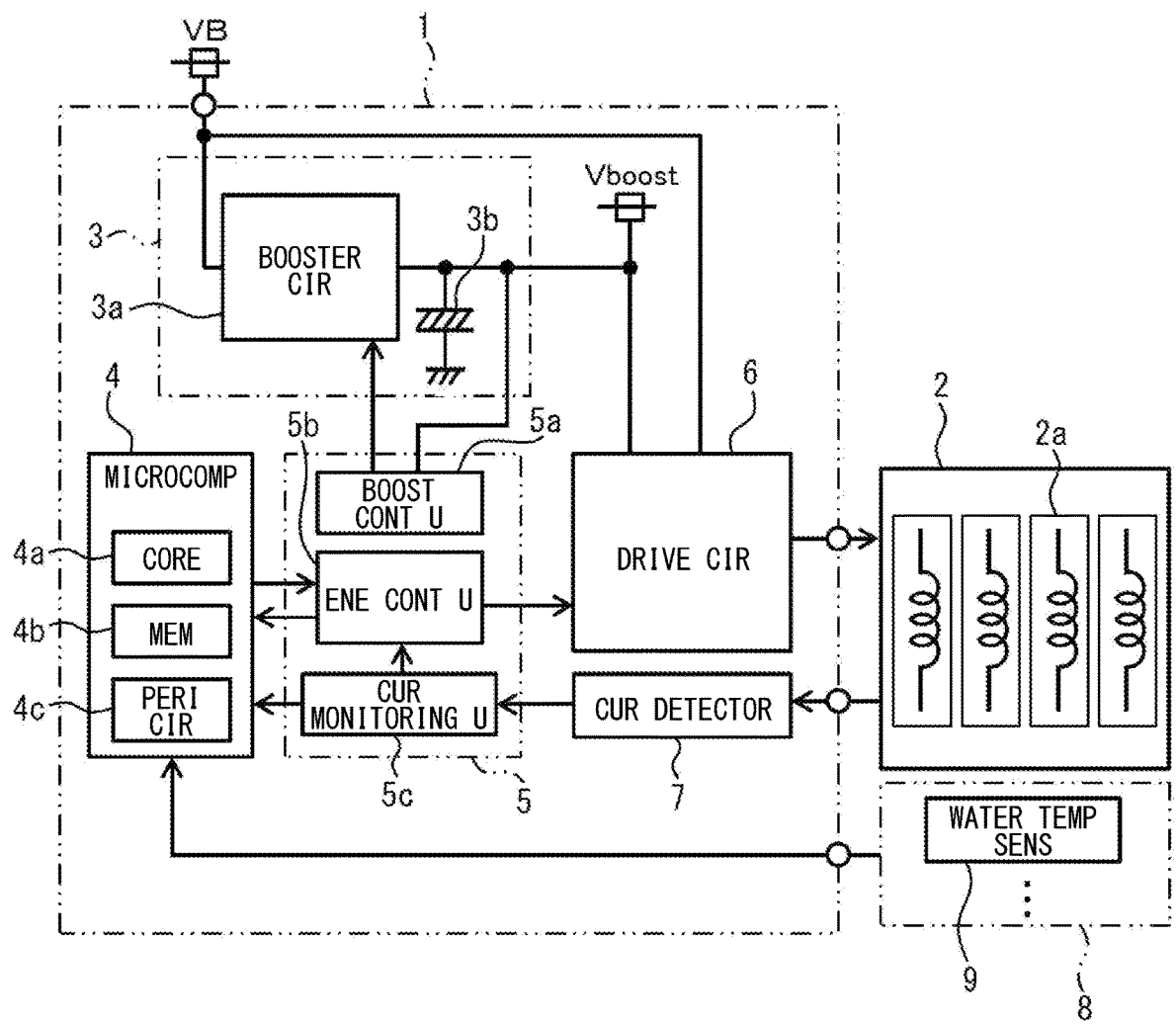
FIG. 1 is an electrical configuration diagram illustrating an embodiment.

If the gradient of energization current of the fuel injection valve becomes lower than the gradient of the ideal current profile due to various factors such as a peripheral temperature environment and aged deterioration, an actual injection quantity may be largely reduced from the command injection quantity, which may result in deterioration of an A/F value. In order to prevent such a problem, it is desirable to previously adjust an energization instruction time for energization to the fuel injection valve to a rather long time factoring in variations. However, if the rather long energization instruction time is ensured, the fuel efficiency may be reduced.

In view of this, the applicant of the present application studies correction of the energization time using a current area correction technique based on an integrated current of the ideal current profile serving as a target current to reach a target peak current and an integrated current of detected current.

According to this method, when the actual energization current profile becomes lower than the ideal current profile, the energization instruction time is corrected by executing an area correction process in real time, thereby making it possible to drive the fuel injection valve with the command injection quantity previously specified.

However, even if correction of the energization instruction time is performed on the basis of the actual current using the above configuration, a correction time may become disadvantageously abnormally long due to, for example, the occurrence of deterioration in a control system.

In view of the above circumstances, an injection control device is provided such that is configured to correct an energization time so as to compensate for an electric charge amount shortage caused by the difference from the gradient of an actually detected current when the gradient of the current passed to a fuel injection valve becomes lower than an ideal current profile and capable of determining whether the correction of the energization time is appropriately performed.

An injection control device according to an aspect of the present embodiments is an injection control device that current-drives a fuel injection valve that injects fuel into an engine by discharging electric charge stored in a charging capacitor, the injection control device including: a drive controller that controls, in current-driving the fuel injection valve to cause the fuel injection valve to inject fuel, energization by correcting an energization instruction time, the drive controller including an energization time correction amount calculation unit (5*d*) that calculates an energization time correction amount by performing area correction on a current flowing through the fuel injection valve; an estimated energization time correction amount calculation unit that calculates an estimated injection quantity shortage from a current gradient of an ideal current profile, a current gradient of an estimated current profile, and a required energization time, and calculates an estimated energization time correction amount; and a deterioration determination unit that determines deterioration of the charging capacitor on the basis of the calculated estimated energization time correction amount and the energization time correction amount calculated by the drive controller.

With the above configuration, when the energization instruction for the energization instruction time is given to the drive controller, the drive controller controls energization by calculating, using the energization time correction amount calculation unit, the energization time correction amount by performing the area correction on the current flowing through the fuel injection valve from the charging capacitor and correcting the energization instruction time. At this time, the estimated energization time correction amount calculation unit calculates the estimated injection quantity shortage from the current gradient of the ideal current profile, the current gradient of the estimated current profile, and the required energization time, and calculates the estimated energization time correction amount. The deterioration determination unit determines deterioration of the charging capacitor on the basis of the calculated estimated energization time correction amount and the energization time correction amount calculated by the drive controller. This makes it possible to detect a state where the charging capacitor is not charged up to a specified voltage even in a fully-charged state due to deterioration of the charging capacitor and the energization time correction amount is thus increased to a predetermined amount or more.

Hereinbelow, an embodiment of an injection control device will be described with reference to the drawings. As illustrated in FIG. 1, an electronic control unit (ECU) 1 is configured as, for example, an injection control device which controls driving of a solenoid fuel injection valve 2 (also called an injector). The fuel injection valve 2 directly injects fuel in multiple stages into an internal combustion engine mounted on a vehicle such as an automobile. Here, the fuel injection valves 2 for four cylinders are illustrated. However, the present invention can also be applied to a three-cylinder engine, a six-cylinder engine, or an eight-cylinder engine.

The electronic control unit 1 has an electrical configuration including a booster unit 3, a microcomputer 4, a control IC 5, a drive circuit 6, and a current detector 7. The electronic control unit 1 is used as an injection control device that controls injection of fuel. The microcomputer 4 includes one or more cores 4a, a memory 4b such as a ROM and a RAM, and a peripheral circuit 4c such as an A/D converter, and performs various control operations in accordance with a program stored in the memory 4b and sensor signals S acquired from various sensors 8.

The sensors 8 include, for example, a crank angle sensor which outputs a pulse signal every time a crank shaft rotates by a predetermined angle, a water temperature sensor 9 which is disposed on a cylinder block of the internal combustion engine and detects the temperature of a cooling water, a fuel pressure sensor which detects the pressures of fuel at the time of injection, an intake amount sensor which detects the amount of intake air, and an A/F sensor which detects an air-fuel ratio, that is, an A/F value of exhaust gas of the internal combustion engine. The microcomputer 4 detects, as a coil temperature Tc, the temperature of a solenoid coil 2a of the fuel injection valve 2 through the peripheral circuit 4c from a signal captured from the water temperature sensor 9 serving as the temperature sensor.

The microcomputer 4 calculates an engine speed from the pulse signal of the crank angle sensor and acquires the throttle opening from a throttle opening signal. The microcomputer 4 estimates the temperature of the fuel injection valve 2 from the cooling water temperature detected by the water temperature sensor 9. The microcomputer 4 also calculates a target torque required for the internal combustion engine on the basis of the throttle opening, a hydraulic pressure, and the A/F value, and calculates a required injection quantity serving as a target on the basis of the target torque.

The microcomputer 4 calculates an energization instruction time Ti of an energization instruction TQ on the basis of the required injection quantity serving as a target and the fuel pressure detected by the fuel pressure sensor. The microcomputer 4 calculates injection command timing for each cylinder on the basis of the sensor signals input thereto from the various sensors 8 described above and outputs the energization instruction TQ for fuel injection to the control IC 5 at the injection command timing.

The microcomputer 4 can calculate injection start time for each cylinder on the basis of the engine speed calculated from the pulse signal of the crank angle sensor.

The control IC 5 is an integrated circuit device such as an ASIC and includes, for example, a logic circuit, a control main body such as a CPU, a storage unit such as a RAM, a ROM, or an EEPROM, and a comparator (all of which are not illustrated). The control IC 5 is configured to execute various control operations using hardware and software. The control IC 5 has functions of a boost control unit 5a, an energization control unit 5b, and a current monitoring unit 5c.

The booster unit 3 includes a booster circuit 3a including a boost DC-DC converter and a charging capacitor 3b, and operates with a battery voltage VB input thereto. The boost control unit 5a performs control to boost the battery voltage VB input to the booster circuit 3a, charge the charging capacitor 3b with a boost voltage Vboost output from the booster circuit 3a, and supply the boost voltage Vboost to the drive circuit 6.

The battery voltage VB and the boost voltage Vboost are input to the drive circuit 6. The drive circuit 6 applies voltage, that is, the boost voltage Vboost or the battery voltage VB to the solenoid coil 2a of the fuel injection valve 2 of each cylinder in accordance with energization control of the energization control unit 5b of the control IC 5, thereby driving the fuel injection valve 2 to cause the fuel injection valve 2 to inject fuel.

The current detector 7 includes a current detection resistor. The current monitoring unit 5c of the control IC 5 includes, for example, a comparator and an A/D converter (both of which are not illustrated), and monitors a current flowing through the solenoid coil 2a of the fuel injection valve 2 through the current detector 7.

Figure 2:
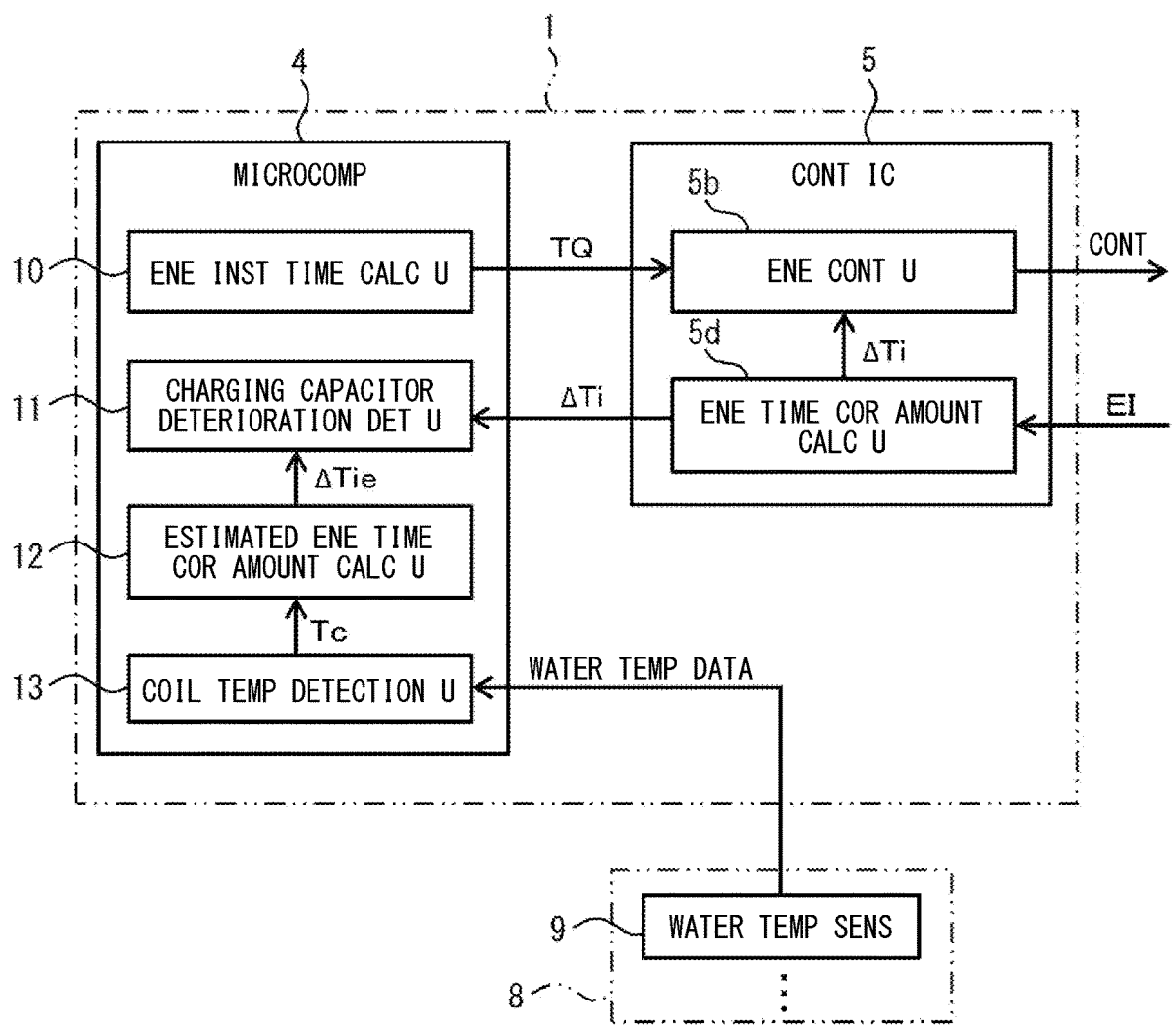
FIG. 2 is a functional block diagram of a microcomputer and a control IC.

FIG. 2 schematically illustrates a part of the functional configuration of the microcomputer 4 and the control IC 5. The microcomputer 4 functions as an energization instruction time calculation unit 10, a charging capacitor deterioration determination unit 11, an estimated energization time correction amount calculation unit 12, and a coil temperature detection unit 13 by the core 4a executing a program stored in the memory 4b. The control IC 5 also has a function of an energization time correction amount calculation unit 5d serving as the area correction unit in addition to the functions of the boost control unit 5a, the energization control unit 5b, and the current monitoring unit 5c described above.

The energization instruction time calculation unit 10 calculates, at the start of injection control, the required injection quantity on the basis of the sensor signals S of the various sensors 8 related to the internal combustion engine and calculates the energization instruction time Ti of the energization instruction TQ. The energization instruction time Ti of the energization instruction TQ indicates a time for which an instruction to apply voltage, for example, the boost voltage Vboost to the fuel injection valve 2 is provided in injection control.

The energization instruction time calculation unit 10 sets correction coefficients $\alpha$, $\beta$. The correction coefficients $\alpha$ is used to estimate the current difference between an ideal current profile PI for a current to be passed to the fuel injection valve 2 and an actual energization current EI. The coefficient $\alpha$ is previously calculated according to, for example, the load characteristic of the fuel injection valve 2 and set to a value equal to or larger than zero. The coefficient α is previously recorded in the memory 4b through an a map.

The a map is a map for deriving the correction coefficient α from the energization instruction time Ti of the energization instruction TQ and the fuel pressure detected by the fuel pressure sensor at the time of injection and provided for setting the correction coefficient α in a range from when the current has not reached a peak current to when the current has exceeded the peak current. The correction coefficient α is provided for calculating an energization time correction amount ΔTi in Equations (1) to (4) described later. The energization time correction amount ΔTi can be increased by setting the correction coefficient α to a larger value and can also be made zero by setting the correction coefficient α to zero.

The correction coefficient β is used for estimating a peak current estimation value Ipki for injection control and previously set for correcting an error caused by the nonlinearity of the energization current EI according to, for example, the load characteristic of the fuel injection valve 2.

The energization instruction time Ti of the energization instruction TQ is input to the energization control unit 5b of the control IC 5, and the correction coefficients α, β are input to the energization time correction amount calculation unit 5d. When energization instruction time Ti of the energization instruction TQ is input to the energization control unit 5b of the control IC 5, the energization control unit 5b applies power (e.g., the boost voltage Vboost) to the fuel injection valve 2 from the drive circuit 6. On the other hand, the energization time correction amount calculation unit 5d of the control IC 5 calculates the energization time correction amount ΔTi by acquiring a current flowing through the fuel injection valve 2 and performing area correction on the acquired current when the energization control unit 5b current-drives the fuel injection valve 2 to cause the fuel injection valve 2 to inject fuel.

The energization time correction amount calculation unit 5d feeds back the calculated energization time correction amount ΔTi to the energization control unit 5b. The energization control unit 5b reflects, in real time, the energization time correction amount ΔTi in the energization instruction time Ti of the energization instruction TQ input corresponding to a certain injection to control energization of the fuel injection valve 2.

In the microcomputer 4, the estimated energization time correction amount calculation unit 12 calculates an estimated energization time correction amount ΔTie as described later. In the calculation of the estimated energization time correction amount ΔTie, the coil temperature Tc is captured from the coil temperature detection unit 13.

The coil temperature detection unit 13 captures water temperature data from the water temperature sensor 9 and detects the captured water temperature as the coil temperature Tc. The temperature of the fuel injection valve 2, that is, the temperature of the solenoid coil 2a is substantially equal to the temperature of the engine cooling water detected by the water temperature sensor 9. Thus, the coil temperature Tc is detected on the basis of the water temperature data.

The charging capacitor deterioration determination unit 11 determines a deteriorated state of the charging capacitor 3b by comparing the value of the energization time correction amount ΔTi calculated by the energization time correction amount calculation unit 5d of the control IC 5 with the estimated energization time correction amount ΔTie calculated by the estimated energization time correction amount calculation unit 12.

Next, a detailed operation of fuel injection performed by the fuel injection valve 2 will be described.

When the battery voltage VB is applied to the electronic control unit 1, the microcomputer 4 and the control IC 5 are activated. The boost control unit 5a of the control IC 5 boosts an output voltage of the booster circuit 3a of the booster unit 3 by outputting a boost control pulse to the booster circuit 3a and charges the charging capacitor 3b with the boosted output voltage. The charging capacitor 3b is charged with the boost voltage Vboost up to a predetermined boost completion voltage level exceeding the battery voltage VB.

At ON timing t0 when an energization instruction is issued, that is, at the start of energization and peak current control, the microcomputer 4 calculates, using the energization instruction time calculation unit 10, the required injection quantity and the energization instruction time Ti of the energization instruction TQ, and outputs the calculated energization instruction time Ti to the energization control unit 5b of the control IC 5. Accordingly, the microcomputer 4 provides the control IC 5 with the energization instruction time Ti through the energization instruction TQ.

The control IC 5 stores, in an internal memory, the ideal current profile PI serving as a target current to be passed to the fuel injection valve 2 and performs the peak current control so that the energization current reaches the target peak current Ipk by applying the boost voltage Vboost to the solenoid coil 2a on the basis of the ideal current profile PI under control of the energization control unit 5b.

Figure 3:
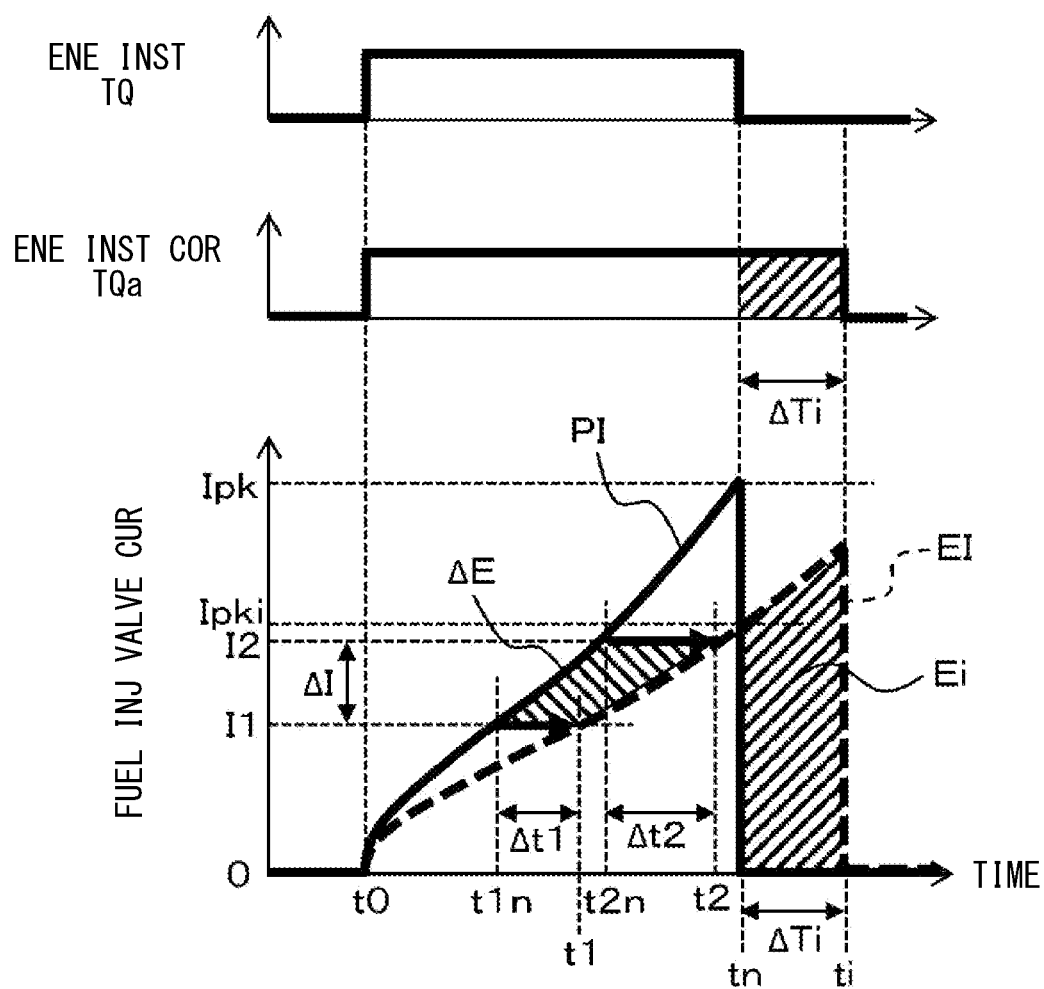
FIG. 3 is an explanatory diagram of a method for calculating an integrated current difference.
Figure 4:
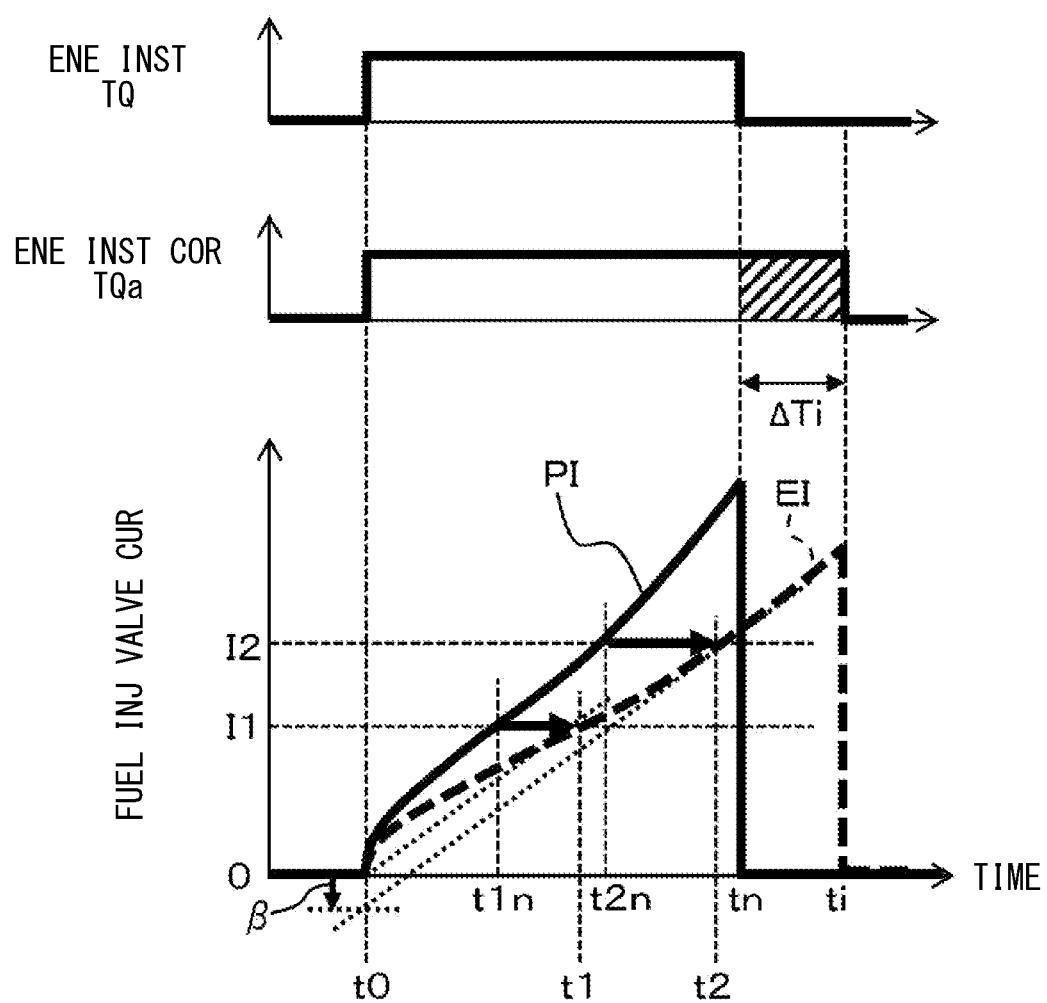
FIG. 4 is an explanatory diagram of a method for calculating a peak current estimation value.

The control IC 5 continuously applies the boost voltage Vboost to between terminals of the solenoid coil 2a until the energization current reaches the peak current target value Ipk indicated by the ideal current profile on the basis of the energization instruction time Ti of the energization instruction TQ. The energization current EI of the fuel injection valve 2 rapidly increases to open the fuel injection valve 2. As illustrated in FIG. 3, the energization current EI of the fuel injection valve 2 nonlinearly varies on the basis of the structure of the fuel injection valve 2.

The energization time correction amount calculation unit 5d calculates an energy shortage Ei which is the integrated current difference between the ideal current profile PI and the actual energization current EI passed to the fuel injection valve 2. The energy shortage Ei corresponds to an area surrounded by nonlinear current curves. Thus, in order to calculate the energy shortage Ei in detail, an operation load tends to increase. Thus, the area ΔE of a trapezoid with four vertices (t1n, I1), (t1, I1), (t2n, I2), (t2, I2) illustrated in FIG. 3 may be regarded as being substantially proportional to the energy shortage Ei for simple calculation.

[Equation 1]

$$\Delta E = \{(t1-t1n)+(t2-t2n)\} \times (I2-I1)/2 \qquad (1)$$

Thus, the energization time correction amount calculation unit 5d can simply calculate the integrated current difference between the ideal current profile PI from ideal arrival time t1n to reach a current threshold I1 to ideal arrival time t2n to reach a current threshold I2 and the energization current EI of the fuel injection valve 2 from arrival time t1 to actually reach the current threshold I1 to arrival time t2 to actually reach the current threshold I2, that is, the area ΔE. The energization time correction amount calculation unit 5d calculates the energy shortage Ei by multiplying the calculated area ΔE by the correction coefficient α, which is previously set, as represented by Equation (2).

[Equation 2]

$$Ei = \Delta E \times a = \{(t1 - t1n) + (t2 - t2n)\} \times (I2 - I1)/2 \times \alpha \quad (2)$$

As illustrated in FIG. 3, the energization time correction amount calculation unit 5d calculates the peak current estimation value Ipki at a point in time when the energization instruction time Ti indicated by the energization instruction TQ elapses by calculating a current gradient from the ON timing t0 of an injection instruction signal to the arrival time t1 to reach the current threshold I1. At this time, the peak current estimation value Ipki can be calculated by adding the correction coefficient β as an intercept as represented by Equation (3) taking into consideration that the energization current EI is nonlinear.

[Equation 3]

$$Ipki = \frac{I1}{t1} \times Ti + \beta \quad (3)$$

The correction coefficient β is set as an offset term for accurately estimating the peak current estimation value Ipki at application OFF timing tn of the ideal current profile PI. Although, in Equation (3), the current gradient of the energization current profile EI is calculated as the gradient from the ON timing t0 of the energization instruction TQ to the time t1 to reach the current threshold I1, the current gradient may be calculated as the gradient from the ON timing t0 to the time t2 to reach the current threshold I2.

Next, as illustrated in FIG. 3, the energization time correction amount calculation unit 5d calculates the energization time correction amount ΔTi for compensating for the energy shortage Ei. Specifically, as represented by Equation (4), the energization time correction amount calculation unit 5d calculates the energization time correction amount ΔTi by dividing the calculated energy shortage Ei by the estimated peak current estimation value Ipki.

[Equation 4]

$$\Delta Ti = \frac{Ei}{Ipki} = \frac{\{(t1 - t1n) + (t2 - t2n)\} \times (I2 - I1)/2 \times \alpha}{\frac{I1}{t1} \times Ti + \beta} =$$

$$\frac{\{(t1 - t1n) + (t2 - t2n)\} \times (I2 - I1) \times \alpha x \times t1}{I1 \times Ti + \beta \times t1} \quad (4)$$

$$\alpha x = \alpha/2$$

Although, in the above Equation (4), multiplication by a gain value for converting an A/D conversion value of the detected current I1, I2 into a physical quantity is actually performed, this multiplication is omitted in Equation (4). Note that, in Equation (4), the term including division by 2 is indicated as αx so as to be included in the coefficient α. It is possible to reduce an operation load required for a process for calculating an extension time for compensating for the energy shortage Ei by deriving the energization time correction amount ΔTi using Equation (4) dependent on the energy shortage Ei and the peak current estimation value Ipki.

When the energization time correction amount calculation unit 5d outputs the calculated energization time correction amount ΔTi to the energization control unit 5b, the energization control unit 5b corrects the energization instruction time Ti to an energization instruction calculated value of the energization instruction TQ+the energization time correction amount ΔTi as a corrected energization instruction time Ti of the energization instruction TQ by timing when a current I detected by the current monitoring unit 5c reaches the peak current estimation value Ipki. This makes it possible to simply correct the energization instruction time Ti of the energization instruction TQ and extend the energization time.

The energization time correction amount calculation unit 5d calculates the energization time correction amount ΔTi in a period from when the current I reaches the current threshold I2 to the timing tn when the current I reaches the peak current estimation value Ipki. Thus, the energization instruction time Ti can be corrected with sufficient time. Although a mode in which the energization instruction time correction amount ΔTi is calculated using Equations (1) to (4) has been described, these equations merely show an example, and the present invention is not limited to this method.

For the correction coefficient α, the a map can be set corresponding to all settable energization times. The energization time correction amount calculation unit 5d can calculate the energization time correction amount ΔTi by performing the area correction using the correction coefficients α, β every time injection is performed as described above regardless of whether the driving current of the fuel injection valve 2 has reached the target peak current Ipk.

As described above, when the energization instruction TQ for the energization instruction time Ti is given to the control IC 5 from the energization instruction time calculation unit 10 of the microcomputer 4, the control IC 5 performs energization control on the fuel injection valve 2 so as to accomplish the energization instruction TQ. In the present embodiment, when the driving current of the fuel injection valve 2 does not reach the target peak current Ipk by the target time tn, the control IC 5 calculates, using the energization time correction amount calculation unit 5d, the energization time correction amount ΔTi and adds the calculated energization time correction amount ΔTi to the energization instruction time Ti, thereby achieving fuel injection corresponding to the energization instruction TQ.

On the other hand, the microcomputer 4 determines the deteriorated state of the charging capacitor 3b in a control system by determining whether the energization time correction amount ΔTi calculated by the control IC 5 is within an appropriate range through a comparison with the estimated energization time correction amount ΔTie calculated separately from the setting of the control IC 5. The microcomputer 4 performs this determination process in accordance with the flow of a deterioration determination process illustrated in FIG. 5.

Specifically, in step S100, the microcomputer 4 first determines whether the current operation of the fuel injection valve 2 is single injection. In the single injection, a sufficient time has elapsed from the previous injection. Thus, a sufficient time for charging to the charging capacitor 3b performed by the booster unit 3 is ensured. Therefore, it can be determined that the charging capacitor 3b is in a fully-charged state.

When the determination result is YES in step S100, the microcomputer 4 proceeds to step S110. When the determination result is NO in step S100, the microcomputer 4 finishes the determination process. In step S110, the microcomputer 4 captures, into the estimated energization time correction amount calculation unit 12, the coil temperature Tc from the water temperature data from the water temperature sensor 9, the water temperature data being acquired by the coil temperature detection unit 13.

Next, in step S120, the microcomputer 4 determines whether the coil temperature Tc is within a predetermined temperature range. When the coil temperature Tc, that is, the temperature Tc of the solenoid coil 2a of the fuel injection valve 2 exceeds the predetermined temperature range, a resistance value increases. Thus, it is necessary to correct the estimated current according to the resistance value. In order to reduce the processing load for the determination process and also improve the accuracy of the determination process, a condition under which the coil temperature Tc is within the predetermined temperature range and correction caused by increase in the resistance value of the solenoid coil 2a becomes not necessary is determined.

When the determination result is YES in step S120, the microcomputer 4 acquires, using the charging capacitor deterioration determination unit 11, data of the energization time correction amount ΔTi from the energization time correction amount calculation unit 5d of the control IC 5 in the following step S130.

Then, in step S140, the microcomputer 4 calculates, using the estimated energization time correction amount calculation unit 12, the estimated energization time correction amount ΔTie. A process of calculating the estimated energization time correction amount ΔTie will be descried later.

Next, the microcomputer 4 proceeds to step S150, and subtracts the value of the estimated energization time correction amount ΔTie from the value of the energization time correction amount ΔTi to calculate the difference therebetween and determines whether the calculated difference is equal to or smaller than a threshold Tx as a maximum difference value.

At this time, when the charging capacitor 3b is charged as specified, the value of the estimated energization time correction amount ΔTie is estimated excluding other variables. Thus, the value of the energization time correction amount ΔTi is not largely deviated from the value of the estimated energization time correction amount ΔTie. Therefore, when it is determined that the calculated difference is equal to or smaller than the threshold Tx in step S150 (S150: YES), the microcomputer 4 proceeds to step S160 and determines that the charging capacitor 3b is in a normal state.

On the other hand, when the determination result is NO in step S150, the microcomputer 4 can estimate that the charge amount is insufficient due to a deteriorated state even though the charging capacitor 3b is fully charged. Thus, the microcomputer 4 shifts to step S170 and determines that the charging capacitor 3b is in a deteriorated state.

Next, the above-mentioned calculation of the estimated energization time correction amount ΔTie performed by the microcomputer 4 will be described with reference to FIG. 6. Information necessary for the calculation of the estimated energization time correction amount ΔTie includes an estimated charge amount of the charging capacitor 3b and the temperature of the fuel injection valve 2, that is, the coil temperature Tc of the solenoid coil 2a.

The gradient of the energization current of the fuel injection valve 2 has a dependence on the coil temperature Tc and the charge amount of the charging capacitor 3b. That is, as the coil temperature Tc increases, the resistance value of the solenoid coil 2a increases, which reduces the gradient of the energization current. Also, as the charge amount of the charging capacitor 3b decreases, the gradient of the energization current decreases.

Thus, when the coil temperature Tc of the fuel injection valve 2 estimated from the water temperature sensor 9 for the engine is within a normal range, it can be considered that the cause of reduction in the gradient of the energization current of the fuel injection valve 2 is a small charge amount of the charging capacitor 3b.

The charge amount of the charging capacitor 3b is the amount of electric charge stored therein. The amount of electric charge Q is represented by the following Equation (5). Thus, a value of a voltage U is uniquely determined in a fully-charged state.

$$Q = C \times U \tag{5}$$

Q: charge amount (amount of electric charge)
C: capacitance
U: voltage

Thus, it can be estimated that the cause of reduction in the capacitor charge amount Q is reduction in the capacitor capacitance C, and this state can be determined to be a state where the charging capacitor 3b is deteriorated.

Accordingly, in a case where the charging capacitor 3b is in a fully-charged state, the coil temperature Tc estimated from the engine water temperature is within the normal range, and fuel injection is in a direct and single injection mode, if there is a deviation exceeding the threshold Tx between the value of the estimated energization time correction amount ΔTie estimated by the microcomputer 4 and the value of the energization time correction amount ΔTi calculated by the control IC 5, the microcomputer 4 can determine that the charging capacitor 3b is in a deteriorated state.

Based on the above conditions, in a state where the charging capacitor 3b is not deteriorated, the state at full charge can be recognized on the basis of the previously known conditions. Thus, the microcomputer 4 can calculate an estimated current ESI.

Figure 6:
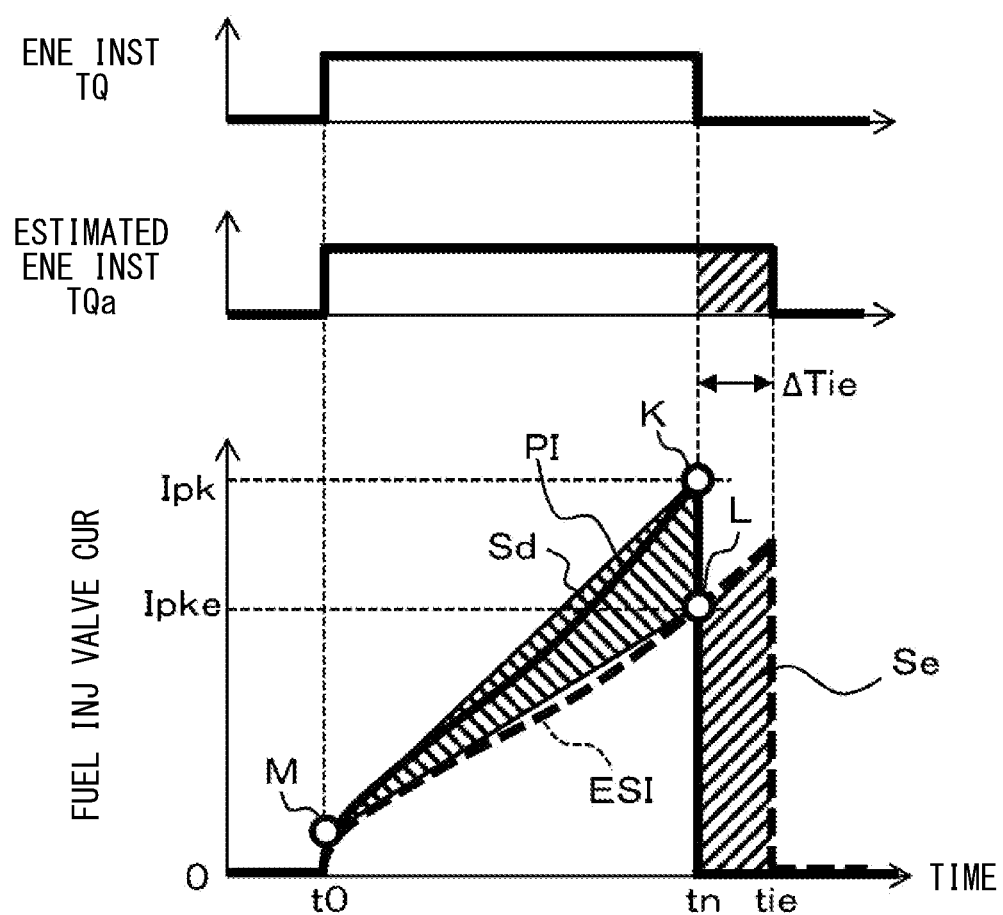
FIG. 6 is an explanatory diagram of a method for calculating an estimated energization time correction amount.

Consequently, as illustrated in FIG. 6, the microcomputer 4 can calculate the estimated energization time correction amount ΔTie so as to ensure a current area Se corresponding to a difference area Sd by executing current area correction control by calculating the difference area Sd from the difference between the current gradient of the ideal current profile PI and the current gradient of the estimated current ESI.

In this case, in a state where the charging capacitor 3b is not deteriorated, the energization time correction amount ΔTi calculated by the control IC 5 and the estimated energization time correction amount ΔTie are not largely deviated from each other. However, if the charging capacitor 3b is deteriorated, which reduces, even in a fully-charged state, the energization current EI to a value lower than that in a state where the charging capacitor 3b is not deteriorated, the energization time correction amount ΔTi calculated by the control IC 5 and the estimated energization time correction amount ΔTie are largely deviated from each other.

Thus, the microcomputer 4 can determine that the charging capacitor 3b is in a deteriorated state on such conditions.

Figure 5:
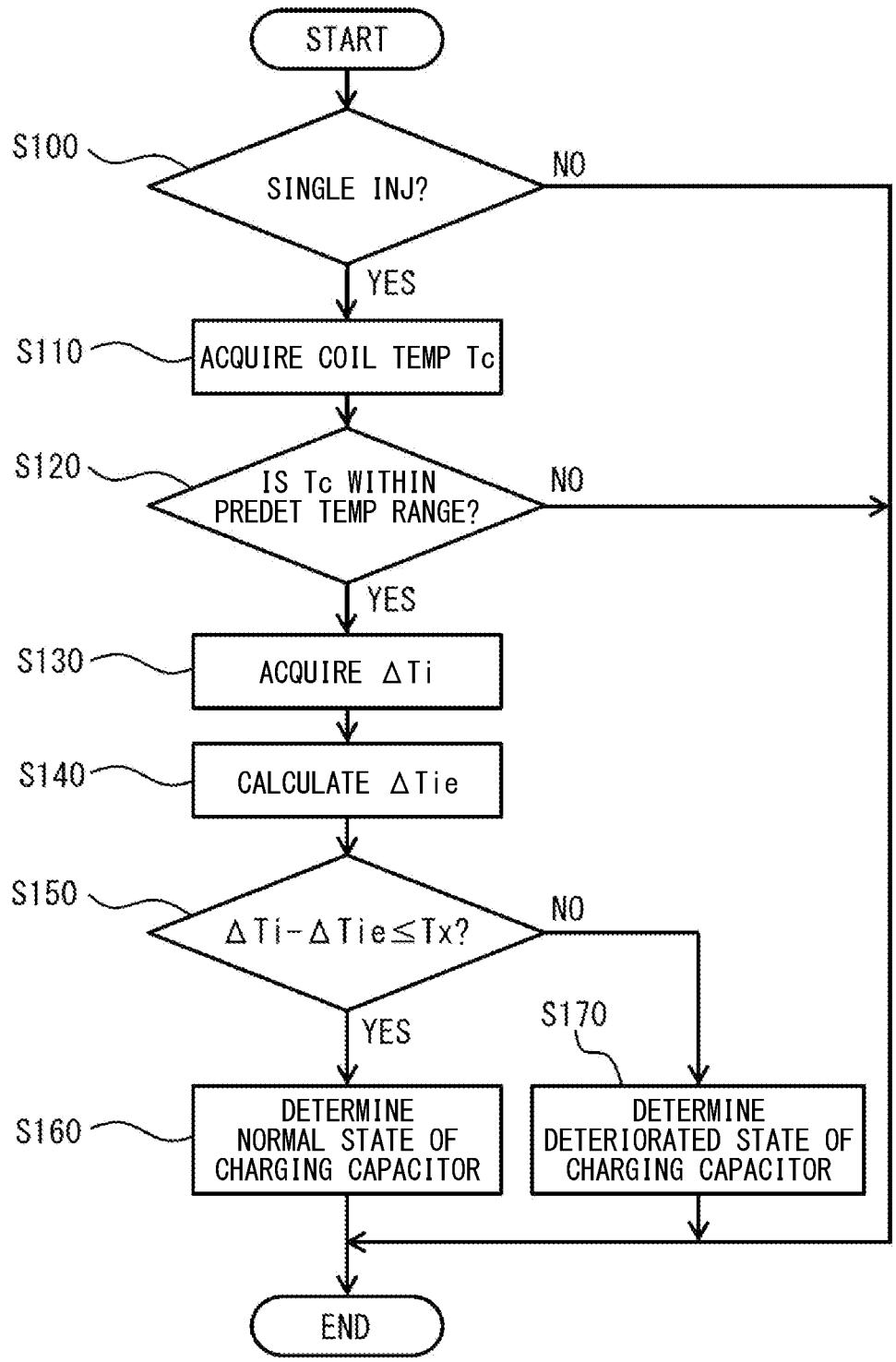
FIG. 5 is a flowchart of a charging capacitor deterioration determination process.

In the flow of the determination process in FIG. 5 described above, the determination process is performed, in steps S100 and S120, using the conditions that the charging capacitor 3b is in a fully-charged state and the coil temperature Tc is equal to or lower than the predetermined temperature Tth. However, when the accuracy of calculating the charge amount of the charging capacitor 3b and the estimated current ESI is high, the determination process can also be performed without limiting the determination conditions to any particular condition by adjusting the estimated current ESI in calculation taking into consideration these conditions.

According to the present embodiment as described above, the deteriorated state of the charging capacitor 3b can be determined under a certain condition by comparing the energization time correction amount ΔTi calculated by the control IC 5 with the estimated energization time correction amount ΔTie calculated by the microcomputer 4.

In the above determination process, since the determination conditions are that fuel injection is single injection and the coil temperature Tc is within the predetermined range, the microcomputer 4 can uniquely estimate the estimated energization time correction amount ΔTie for the charging capacitor 3b with no deterioration.

As described above, when the charge state of the charging capacitor 3b can be accurately estimated and the correction can be performed according to the coil temperature Tc, the deterioration determination process can be performed without the determination conditions of the single injection and the coil temperature Tc.

In this case, the deterioration determination process can be performed by calculating the estimated current ESI according to the fuel injection condition and the coil temperature Tc at the calculation of the control IC 5 with the energization current EI and calculating the estimated energization time correction amount ΔTie for the energization current correction amount ΔTi under these conditions.

Other Embodiments

The present disclosure should not be limited to the embodiments described above, and various modifications may further be implemented without departing from the gist of the present disclosure. For example, the following modifications or extensions are possible. The embodiments described above may be combined as necessary.

In the above embodiment, the present invention is applied, as the fuel injection valve 2, to direct injection that directly injects fuel into a combustion chamber of the internal combustion engine. However, the present invention is not limited thereto and may be applied to port injection that injects fuel in front of a known intake valve.

The above embodiment describes the mode in which the energy shortage ΔE corresponding to the integrated current difference is simply calculated by calculating the area of the trapezoid. However, when the computing power is high, the energy shortage ΔE can be calculated under a condition for further increasing the accuracy.

The energization current EI of the fuel injection valve 2 nonlinearly varies both before and after reaching the peak current Ipk. Thus, it is preferable to simply calculate the integrated current difference by approximately calculating the integrated current using a polygon such as a triangle, a rectangle, or a trapezoid.

Although the mode in which the microcomputer 4 and the control IC 5 are configured as separate integrated circuits has been described, the microcomputer 4 and the control IC 5 may be integrated with each other. In this case, it is preferable to use an arithmetic processor capable of performing a high-speed operation.

The present invention has been described in accordance with the embodiment described above. However, it is to be understood that the present invention is not limited to the embodiment and structure. The present disclosure encompasses various modifications and variations within the scope of equivalents. In addition, various modes/combinations, one or more elements added/subtracted thereto/therefrom, may also be considered as the present disclosure and understood as the technical thought thereof.

In the drawing, 1 is an electronic control device (injection control device), 2 is a fuel injection valve, 4 is a microcomputer (microcomputer), 5 is a control IC, 5b is an energization control unit, 5d is an energization time correction amount calculation unit, and 9 is. A water temperature sensor (temperature sensor), 10 is an energization instruction time calculation unit, 11 is a charging capacitor deterioration determination unit, 12 is an estimated energization time correction amount calculation unit, and 13 is a coil temperature detection unit.

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

It is noted that a flowchart or the processing of the flowchart in the present application includes sections (also referred to as steps), each of which is represented, for instance, as S100. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An injection control device that executes a current-drive of a fuel injection valve to inject fuel into an engine by discharging an electric charge stored in a charging capacitor, the injection control device comprising:
   a drive controller that controls energization by correcting an energization instruction time when injecting the fuel by executing the current-drive of the fuel injection valve, and includes an energization time correction amount calculation unit that calculates an energization time correction amount by performing area correction on a current flowing through the fuel injection valve;
   an estimated energization time correction amount calculation unit that calculates an estimated injection quantity shortage from a current gradient of an ideal current profile, a current gradient of an estimated current profile, and a required energization time, and calculates an estimated energization time correction amount; and
   a deterioration determination unit that determines deterioration of the charging capacitor based on the calculated estimated energization time correction amount and the energization time correction amount calculated by the drive controller.

2. The injection control device according to claim 1, wherein:
the deterioration determination unit uses a calculation result at a single injection of the fuel injection valve as the energization time correction amount.

3. The injection control device according to claim 1, wherein:
the deterioration determination unit determines that the charging capacitor is deteriorated when the energization time correction amount is larger than the estimated energization time correction amount by a predetermined amount.

4. The injection control device according to claim 1, further comprising:
a temperature sensor that detects a temperature of the fuel injection valve, wherein:
the deterioration determination unit determines that the charging capacitor is deteriorated when the temperature of the fuel injection valve detected by the temperature sensor is within a predetermined temperature range.

5. The injection control device according to claim 1, further comprising:
one or more processors; and
a memory coupled to the one or more processors and storing program instructions that when executed by the one or more processors cause the one or more processors to provide at least: the drive controller; the estimated energization time correction amount calculation unit; and the deterioration determination unit.

* * * * *